US012756393B2

(12) United States Patent
Perroni et al.

(10) Patent No.: US 12,756,393 B2
(45) Date of Patent: Oct. 6, 2026

(54) CONTROL DEVICE FOR A SWITCHING VOLTAGE REGULATOR AND CONTROL METHOD

(71) Applicant: STMicroelectronics International N.V., Geneva (CH)

(72) Inventors: Maurizio Francesco Perroni, Messina (IT); Davide Manfré, Pandino (IT); Massimo Caruso, Messina (IT); Cesare Torti, Pavia (IT); Fabio Enrico Carlo Disegni, Spino d'Adda (IT)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/764,672

(22) Filed: Jul. 5, 2024

(65) Prior Publication Data

US 2025/0030418 A1 Jan. 23, 2025

(30) Foreign Application Priority Data

Jul. 21, 2023 (IT) ........................ 102023000015405

(51) Int. Cl.
*H03K 17/687* (2006.01)

(52) U.S. Cl.
CPC ................................ *H03K 17/6871* (2013.01)

(58) Field of Classification Search
CPC .................................................. H03K 17/6871
See application file for complete search history.

(56) References Cited

U.S. PATENT DOCUMENTS 6,411,554 B1 * 6/2002 Kawai .................... G11C 5/145 365/189.11
7,385,377 B2 6/2008 Pisasale et al.
8,390,342 B2 * 3/2013 Jang ................. H03K 19/00315 327/108
9,219,482 B2 12/2015 Kwon et al.
10,714,183 B2 7/2020 Kim et al.
11,430,519 B2 * 8/2022 Passerini ................ G11C 16/30
2011/0148368 A1 6/2011 Burns et al.
2012/0008391 A1 * 1/2012 Lee ........................ G11C 16/30 327/427
2016/0315539 A1 10/2016 Lee et al.
2021/0287747 A1 * 9/2021 Passerini ................ G11C 16/30
2021/0408891 A1 12/2021 Yao et al.
2022/0321116 A1 10/2022 Niikura
2023/0015995 A1 1/2023 Jodka

* cited by examiner

*Primary Examiner* — Thomas J. Hiltunen
*Assistant Examiner* — Khareem E Almo
(74) *Attorney, Agent, or Firm* — Slater Matsil, LLP

(57) ABSTRACT

A switch circuit includes a first and a second input nodes to receive a first and a second input voltages, and an output node to produce an output voltage switchable between the first and second input voltages. A first and a second pass devices are arranged in series between the first input node and the output node. A third and a fourth pass devices are arranged in series between the second input node and the output node. A first, a second, a third, and a fourth elevator circuits control, respectively, the first, second, third, and fourth pass devices. The first elevator circuit is biased between the first input voltage and a shifted ground voltage. The third elevator circuit is biased between the second input voltage and a ground voltage. The second and fourth elevator circuits are biased between the output voltage and an elevated ground voltage.

20 Claims, 4 Drawing Sheets

CONTROL DEVICE FOR A SWITCHING VOLTAGE REGULATOR AND CONTROL METHOD

CROSS-REFERENCE TO RELATED APPLICATIONS

This application claims priority to Italian Application No. 102023000015405, filed on Jul. 21, 2023, which application is hereby incorporated by reference herein in its entirety.

TECHNICAL FIELD

The description relates to high-voltage switch circuits and corresponding methods of operation.

BACKGROUND

High-voltage switches may be applied to non-volatile memories (NVM) where the state of a memory cell can be changed by applying a programming current to the cell itself, such as phase-change memories (PCM), spin-torque magnetoresistive random-access memories (ST-MRAM), and resistive random-access memories (RRAM).

For example, U.S. Pat. No. 9,219,482 B2 discloses a high-voltage switch used to transfer a high voltage in a memory device. The architecture includes a single, high-voltage NMOS transistor that controls the transmission of the high-voltage signal from an input terminal to an output terminal based on the voltage at the gate terminal of the NMOS transistor. The gate terminal of the NMOS transistor is driven using further high-voltage transistors that may be implemented with a triple well structure.

As another example, U.S. Pat. No. 7,385,377 B2 discloses a voltage-down converter used to step down an external supply voltage (e.g., 3 V) to a lower value (e.g., 1.85 V) for a memory device that operates at a much lower voltage. The transconductance between the input node and the output node of the converter can be modulated by activating one or more drivers interposed therebetween. Each driver has two transistors arranged in series between the input and output nodes. The first one is a high-voltage transistor configured to withstand the high power supply voltage, while the second one is a low-voltage transistor configured to switch on and off the driver in a relatively short time.

Other examples include U.S. Pat. No. 10,714,183 B2, US 2023/0015995 A1, US 2022/0321116 A1, and US 2021/0408891 A1.

In some memory applications, high-voltage switches may be used to toggle the voltages that are used during a memory modify operation (e.g., write operation or programming operation) to switch the column supply voltage between, for example, 2 V and 4.8 V. Thus, since the voltage domain of the circuits may be between ground voltage (e.g., 0 V) and a relatively high voltage (e.g., 4.8 V or 5 V), the high-voltage switch circuits are conventionally designed (e.g., sized) for such a voltage rating. Such sizing implies thick gate oxide or large area occupation, and the fabrication of such high-voltage transistors also requires dedicated manufacturing steps and masks that increase manufacturing costs.

Therefore, there is a need in the art to provide improved high-voltage switch circuits that do not rely on high-voltage rating transistors.

SUMMARY

An object of one or more embodiments is to contribute to providing such improved high-voltage switch circuits that can handle high voltages (e.g., in the range of 0 V to about 5 V) without implementing high-voltage rating transistors, but implementing (only) low-voltage rating transistors (e.g., in the range of 0 V to about 2.5 V).

According to one or more embodiments, such an object can be achieved by a switch circuit having the features set forth in the claims that follow.

One or more embodiments may relate to a corresponding method of operation.

The claims are an integral part of the technical teaching provided herein in respect of the embodiments.

According to an aspect of the present description, in a switch circuit a first input node is configured to receive a first input voltage, a second input node is configured to receive a second input voltage lower than the first input voltage, and an output node is configured to produce an output voltage switchable between the first input voltage and the second input voltage. A first pass device and a second pass device are arranged in series between the first input node and the output node. A third pass device and a fourth pass device are arranged in series between the second input node and the output node. A first elevator circuit is configured to receive a first low-voltage control signal and produce a corresponding first shifted control signal to control the first pass device. The first elevator circuit is biased between the first input voltage and a shifted ground voltage. A second elevator circuit is configured to receive a second low-voltage control signal and produce a corresponding second shifted control signal to control the second pass device. The second elevator circuit is biased between the output and elevated ground voltage. A third elevator circuit is configured to receive a third low-voltage control signal and produce a corresponding third shifted control signal to control the third pass device. The third elevator circuit is biased between the second input voltage and a ground voltage. A fourth elevator circuit is configured to receive a fourth low-voltage control signal and produce a corresponding fourth shifted control signal to control the fourth pass device. The fourth elevator circuit is biased between the output and elevated ground voltage.

One or more embodiments may thus provide a switch circuit able to manage high voltages (e.g., in the range of 0 V to 5 V) without resorting to high-voltage rating devices but using (only) low-voltage rating devices (e.g., in the range of 0 V to 2.5 V).

According to another aspect of the present description, a method of operating a switch circuit includes: receiving a first input voltage at a first input node; receiving a second input voltage lower than the first input voltage at a second input node; switching an output node between the first input voltage and the second input voltage to produce the output voltage; receiving a first low-voltage control signal at a first elevator circuit and producing a corresponding first shifted control signal; biasing the first elevator circuit between the first input voltage and a shifted ground voltage; receiving a second low-voltage control signal at a second elevator circuit and producing a corresponding second shifted control signal; biasing the second elevator circuit between the output voltage and an elevated ground voltage; receiving a third low-voltage control signal at a third elevator circuit and producing a corresponding third shifted control signal; biasing the third elevator circuit between the second input voltage and a ground voltage; receiving a fourth low-voltage control signal at a fourth elevator circuit and producing a corresponding fourth shifted control signal; and biasing the fourth elevator circuit between the output voltage and the elevated ground voltage.

BRIEF DESCRIPTION OF THE DRAWINGS

One or more embodiments will now be described, by way of example, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and, hence, do not define the extent of protection or the scope of the embodiments.

Throughout the figures annexed herein, unless the context indicates otherwise, like parts or elements are indicated with like references/numerals and a corresponding description will not be repeated for the sake of brevity.

By way of introduction to the detailed description of exemplary embodiments, reference may be made to FIGS. 1 and 2, discussed in the following.

Figure 1:
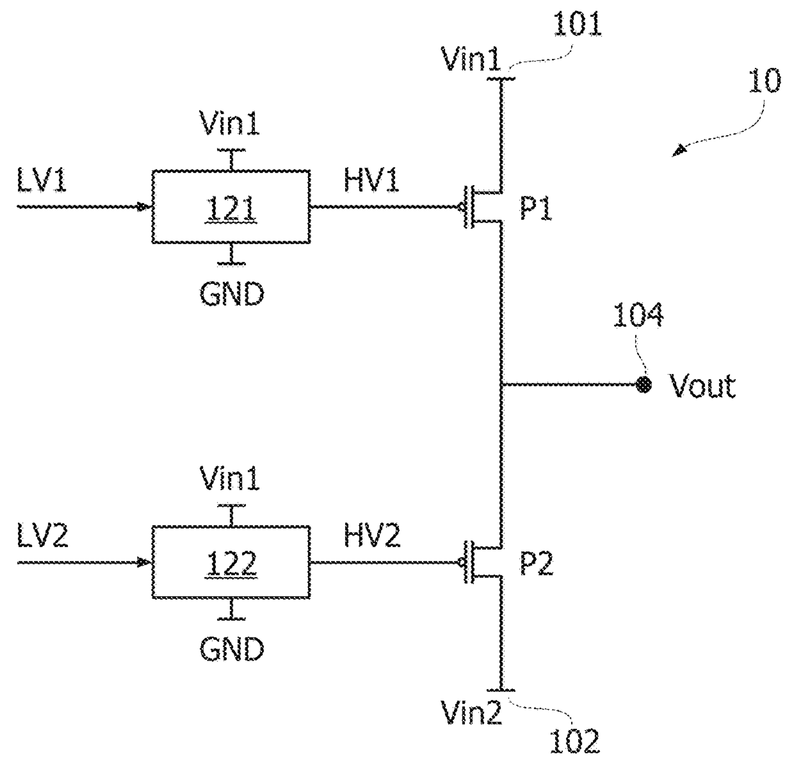
FIG. 1 is a circuit block diagram exemplary of a high-voltage switch circuit.

FIG. 1 is a circuit block diagram exemplary of a high-voltage switch circuit 10. As exemplified in FIG. 1, a high-voltage switch is a circuit that produces an output voltage Vout that can switch between two values, a high value Vin1 (e.g., 5 V) and a low value Vin2 (e.g., 2 V), depending on the value of one or more low-voltage input control signals LV1, LV2 (e.g., with LV1 and LV2 in the voltage range of 0 V to about Vin2).

As exemplified in FIG. 1, a high-voltage switch 10 includes a first control terminal configured to receive a first low-voltage control signal LV1, a second control terminal configured to receive a second low-voltage control signal LV2, a first voltage input terminal 101 configured to receive a first input voltage Vin1, a second voltage input terminal 102 configured to receive a second input voltage Vin2, and an output terminal 104 configured to produce the output voltage Vout.

A first pass device P1 (or pass element, e.g., a transistor, particularly a p-channel MOS transistor) is arranged between the first voltage input terminal 101 and the output terminal 104, and a second pass device P2 (e.g., a transistor, particularly a p-channel MOS transistor) is arranged between the second voltage input terminal 102 and the output terminal 104.

A first elevator circuit 121 biased between Vin1 and ground GND is configured to receive the control signal LV1 and to shift (elevate) it to a higher voltage domain (e.g., in the range of 0 V to Vin1) to produce a first high-voltage control signal HV1 that controls the first pass device P1 (e.g., is received at the gate terminal of MOS transistor P1).

A second elevator circuit 122 biased between Vin1 and ground GND is configured to receive the control signal LV2 and to shift (elevate) it to a higher voltage domain (e.g., in the range of 0 V to Vin1) to produce a second high-voltage control signal HV2 that controls the second pass device P2 (e.g., is received at the gate terminal of MOS transistor P2).

Figure 2:
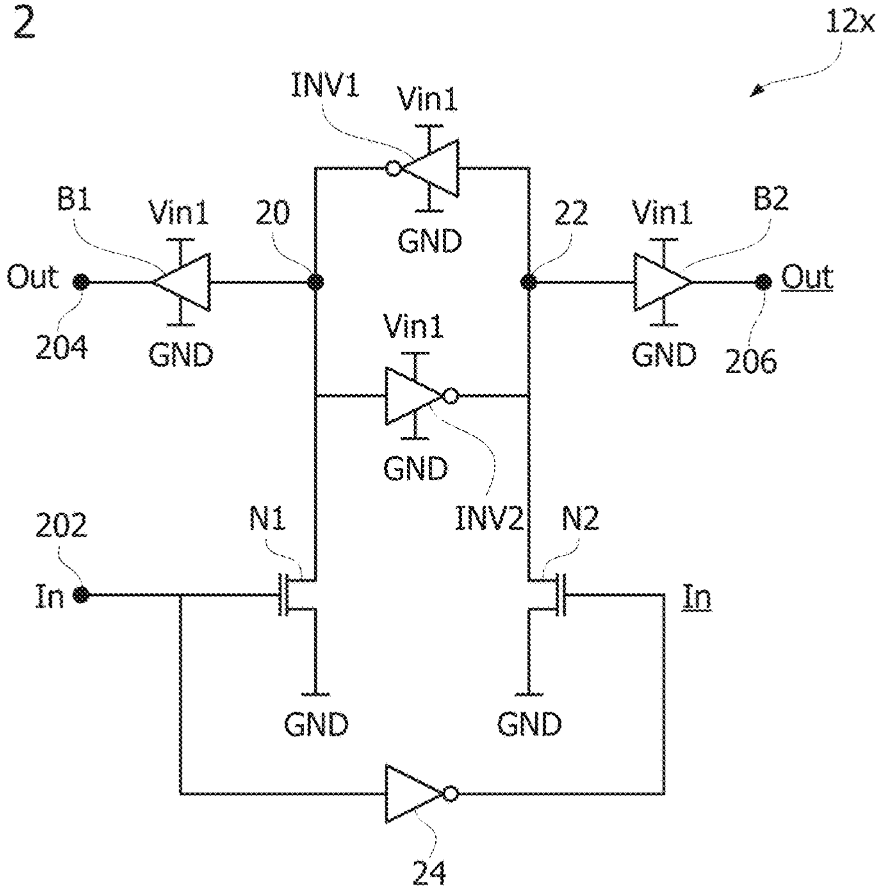
FIG. 2 is a circuit block diagram exemplary of an elevator circuit.

Each of the elevator circuits 121 and 122 (collectively or individually referred to as elevator circuits 12*x*) may have the architecture exemplified in the circuit block diagram of FIG. 2.

An elevator circuit 12*x* includes an input terminal 202 configured to receive a low-voltage input signal In (e.g., LV1 or LV2 with reference to FIG. 1) and an output terminal 204 configured to produce a high-voltage output signal Out (e.g., HV1 or HV2 with reference to FIG. 1).

The elevator circuit 12*x* includes a latch including two inverters INV1 and INV2. Both inverters INV1 and INV2 are biased between Vin1 and ground GND. The output terminal of inverter INV1 is connected to the input terminal of inverter INV2 at node 20, and the output terminal of inverter INV2 is connected to the input terminal of inverter INV1 at node 22.

A transistor N1 (e.g., an n-channel MOS transistor) has a conductive channel arranged between node 20 and ground GND and is configured to receive signal In as a control signal. For instance, transistor N1 has a drain terminal coupled to node 20, a source terminal coupled to ground GND, and a gate terminal coupled to the input terminal 202 of the elevator circuit 12*x*.

A transistor N2 (e.g., an n-channel MOS transistor) has a conductive channel arranged between node 22 and ground GND and is configured to receive the complement In of signal In as a control signal. For instance, transistor N2 has a drain terminal coupled to node 22, a source terminal coupled to ground GND, and a gate terminal coupled to the output of a further inverter circuit 24 that has its input coupled to the input terminal 202 of the elevator circuit 12*x*.

Additionally, a first buffer circuit B1 biased between Vin1 and ground GND has an input terminal connected to node 20 and an output terminal connected to the output terminal 204 of the elevator circuit 12*x* to produce the high-voltage output signal Out.

Optionally, a second buffer circuit B2 biased between Vin1 and ground GND has an input terminal connected to node 22 and an output terminal connected to a further output terminal 206 of the elevator circuit 12*x* to produce the complement Out of the high-voltage output signal Out.

High-voltage switches as exemplified in FIG. 1, implementing elevator circuits as exemplified in FIG. 2, may be used to toggle the "high" voltages that are used during a memory modify operation (e.g., write operation or programming operation) to, for example, switch the column supply voltage between 2 V and 4.8 V. Since the voltage domain of the elevator circuits 121, 122 and of the pass devices P1, P2 may be between ground voltage (e.g., 0 V) and Vin1 (e.g., 5 V), the elevator circuits and the pass devices may be designed (e.g., sized) for such a voltage rating. Such sizing may imply thick gate oxide or large area occupation, and the fabrication of such high-voltage transistors may also require dedicated manufacturing steps and masks that increase manufacturing costs.

Therefore, one or more embodiments relate to an improved high-voltage switch circuit that does not rely on high-voltage rating transistors.

Figure 3:
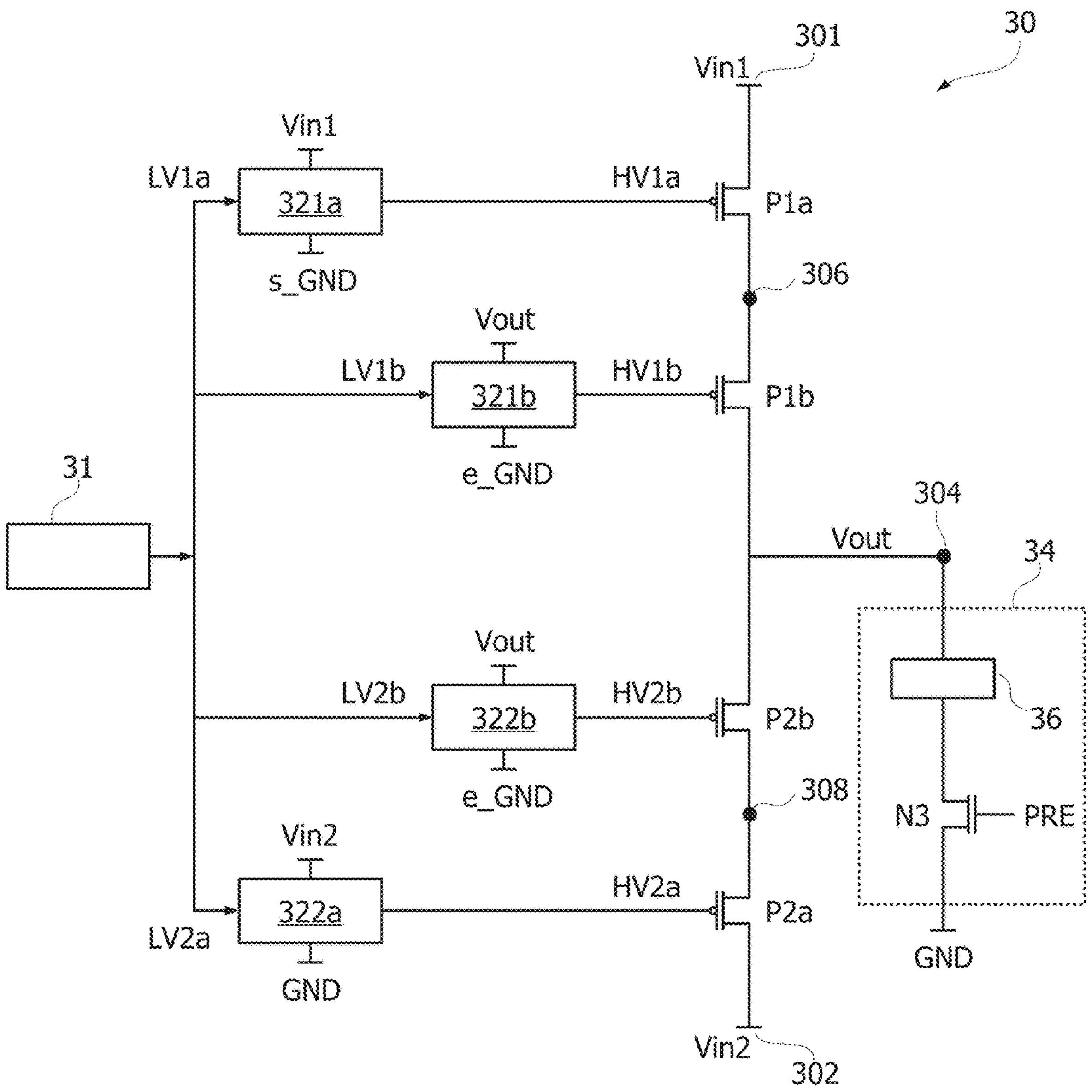
FIG. 3 is a circuit block diagram exemplary of a high-voltage switch circuit.

In detail, FIG. 3 is a circuit block diagram exemplary of a high-voltage switch circuit 30 according to one or more embodiments. As exemplified in FIG. 3, switch 30 includes a first control terminal configured to receive a first low-voltage control signal LV1*a*, a second control terminal configured to receive a second low-voltage control signal LV1*b*, a third control terminal configured to receive a third low-voltage control signal LV2*a*, and a fourth control terminal configured to receive a fourth low-voltage control signal LV2*b*. The low-voltage control signals LV1*a*, LV1*b*, LV2*a*, and LV2*b* may be produced by a control circuit 31 (e.g., a memory control circuit).

As exemplified in FIG. 3, the switch 30 further includes a first voltage input terminal 301 configured to receive a first input voltage Vin1 (e.g., about 5 V), a second voltage input terminal 302 configured to receive a second input voltage Vin2 (e.g., about 2 V), and an output terminal 304 configured to produce the output voltage Vout. A first pass device P1*a* and a second pass device P1*b* (or pass elements, e.g., transistors, particularly p-channel MOS transistors) are arranged in series between the first voltage input terminal 301 and the output terminal 304. For instance, transistor P1*a* has a source terminal coupled to node 301 and a drain terminal coupled to a node 306, and transistor P1*b* has a source terminal coupled to node 306 and a drain terminal coupled to the output node 304. A third pass device P2*a* and a fourth pass device P2*b* (or pass elements, e.g., transistors, particularly p-channel MOS transistors) are arranged in series between the second voltage input terminal 302 and the output terminal 304. For instance, transistor P2*a* has a drain terminal coupled to node 302 and a source terminal coupled to a node 308, and transistor P2*b* has a drain terminal coupled to node 308 and a source terminal coupled to the output node 304.

As exemplified in FIG. 3, switch 30 includes a first elevator circuit 321*a* biased between Vin1 and a shifted ground voltage s_GND. The shifted ground voltage s_GND is a fixed voltage higher than ground (i.e., higher than 0 V) and chosen so that the first elevator circuit 321*a* is subject to a low-voltage domain (e.g., of about 2 V or 2.5 V). For instance, the shifted ground voltage s_GND may be equal to half of voltage Vin1 (e.g., s_GND=Vin1/2=5 V/2=2.5 V) or may be equal to voltage Vin lowered by a certain amount Vx (e.g., s_GND=Vin1−Vx=5 V−2 V=3 V). The first elevator circuit 321*a* is configured to receive the first control signal LV1*a* and to shift (elevate) it to the voltage domain between Vin1 and s_GND to produce a first shifted control signal HV1*a* that controls the first pass device Pia (e.g., is received at the gate terminal of MOS transistor Pia).

As exemplified in FIG. 3, switch 30 includes a second elevator circuit 321*b* biased between Vout and an elevated ground voltage e_GND. The elevated ground voltage e_GND is a variable voltage chosen, as a function of the current value of the output voltage Vout (or, more particularly, as a function of the commutation state of the output voltage Vout), so that the second elevator circuit 321*b* is subject to a low-voltage domain (e.g., of about 2 V or 2.5 V). For instance, the elevated ground voltage e_GND may be equal to ground voltage GND (e.g., 0 V) when the output voltage Vout is low (e.g., equal to Vin2), and may be equal to the shifted ground voltage s_GND when the output voltage Vout is high (e.g., equal to Vin1). The second elevator circuit 321*b* is configured to receive the second control signal LV1*b* and to shift (elevate) it to the voltage domain between Vout and e_GND to produce a second shifted control signal HV1*b* that controls the second pass device P1*b* (e.g., is received at the gate terminal of MOS transistor P1*b*).

As exemplified in FIG. 3, switch 30 includes a third elevator circuit 322*a* biased between Vin2 and ground GND, so that the third elevator circuit 322*a* is subject to a low-voltage domain (e.g., of about 2 V or 2.5 V). The third elevator circuit 322*a* is configured to receive the third control signal LV2*a* and to shift (elevate) it to the voltage domain between Vin2 and GND to produce a third shifted control signal HV2*a* that controls the third pass device P2*a* (e.g., is received at the gate terminal of MOS transistor P2*a*).

As exemplified in FIG. 3, switch 30 includes a fourth elevator circuit 322*b* biased between Vout and the elevated ground voltage e_GND. The fourth elevator circuit 322*b* is configured to receive the fourth control signal LV2*b* and to shift (elevate) it to the voltage domain between Vout and e_GND to produce a fourth shifted control signal HV2*b* that controls the fourth pass device P2*b* (e.g., is received at the gate terminal of MOS transistor P2*b*).

As exemplified in FIG. 3, a precharge circuit 34 may be coupled between the switch output node 304 and ground GND. The precharge circuit 34 may include a pull-down pass device N3 (or pass element, e.g., a transistor, particularly an n-channel MOS transistor) controlled by a precharge signal PRE. The precharge signal (PRE) may be provided, for instance, by the control circuit 31. Optionally, a cascode circuit 36 is connected in series to the pass device N3. For instance, the cascode circuit 36 has a first terminal coupled to node 304 and a second terminal coupled to a drain terminal of the MOS transistor N3. The MOS transistor N3 has a source terminal coupled to ground GND and a gate terminal configured to receive signal PRE. The cascode circuit 36 may include, for instance, one or more diode-connected transistors connected in series, or one or more diodes connected in series.

Resorting to the architecture of FIG. 3, the high-voltage switch 30 allows driving the output node 304 to voltage Vin1 or Vin2 while keeping all the electrical components (e.g., the elevator circuits and the pass devices) in a low voltage range (e.g., a voltage range of about 2 V or 2.5 V). In particular, elevator circuits 321*a* and 322*a* are biased by fixed voltages whose difference (e.g., Vin1-*s*_GND for elevator circuit 321*a* and Vin2-GND for elevator circuit 322*a*) is in the range of about 2 V or 2.5 V, while elevator circuits 321*b* and 322*b* are biased by variable voltages whose difference (e.g., Vout-e_GND for both elevator circuits 321*b* and 322*b*) is kept in the range of about 2 V or 2.5 V. By doing so, transistors Pia, P1*b*, P2*a*, P2*b* as well as the transistors within the elevator circuits 321*a*, 321*b*, 322*a*, 322*b* do not need to be sized for high-voltage rating, and thus can be manufactured with thinner gate oxide, occupying less silicon area or using less photolithographic masks.

In particular, the control circuit 31 may produce the control signals (e.g., LV1*a*, LV1*b*, LV2*a*, LV2*b* as well as PRE) so that the commutation of voltage Vout from the high value Vin1 to the low value Vin2 is carried out in three steps. Initially, transistors P1*a* and P1*b* are conductive (on) and transistors P2*a* and P2*b* are non-conductive (off). In the first commutation step, transistors P1*a* and P1*b* are turned into a non-conductive state (off) and the precharge circuit 34 is activated (e.g., asserting signal PRE) to discharge node 304 and lower the output voltage Vout from Vin1 (e.g., 5 V) to a lower value (e.g., about half of Vin2, such as 2.4 V). In the second commutation step, the elevated ground voltage e_GND is adjusted so as to provide the correct voltage bias to elevator circuits 321*b* and 322*b*, e.g., voltage e_GND is set to ground voltage GND. In the third commutation step, the precharge circuit 34 is deactivated (e.g., de-asserting signal PRE) and transistors P2*a* and P2*b* are turned into a conductive state (on) so that the output voltage Vout is driven to the desired value Vin2.

Similarly, the control circuit 31 may produce the control signals (e.g., LV1*a*, LV1*b*, LV2*a*, LV2*b*, as well as PRE) so that the commutation of voltage Vout from the low-value Vin2 to the high-value Vin1 is carried out in three steps.

Initially, transistors P2*a* and P2*b* are conductive (on) and transistors P1*a* and P1*b* are non-conductive (off). In the first commutation step, transistors P2*a* and P2*b* are turned into a non-conductive state (off).

In the second commutation step, the elevated ground voltage e_GND is adjusted so as to provide the correct voltage bias to elevator circuits 321*b* and 322*b*, e.g., voltage e_GND is set to the shifted ground voltage s_GND. In this step, the value of signal HV1*b* driving transistor P1*b* remains compatible with the switching-on of transistor P1*b*, allowing the output voltage Vout to reach the desired value Vin1.

In the third commutation step, transistors P1*a* and P1*b* are turned into a conductive state (on) so that the output voltage Vout is driven to the desired value Vin1.

Figure 4:
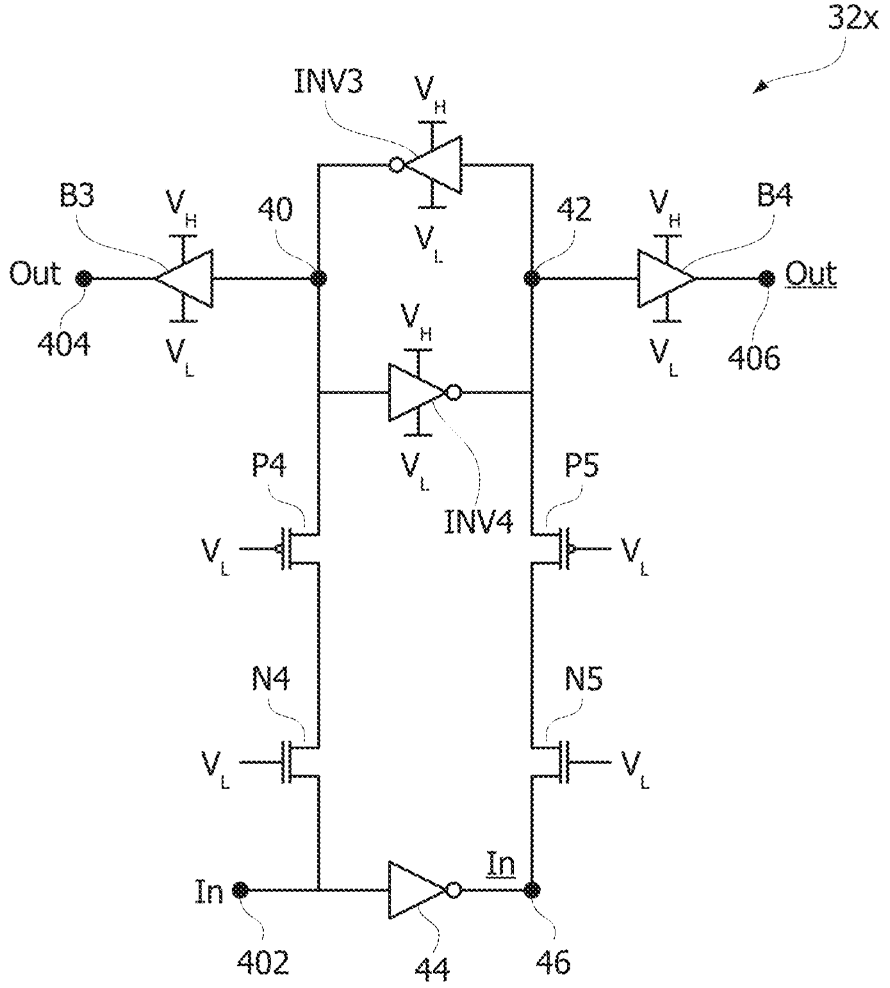
FIG. 4 is a circuit block diagram exemplary of an elevator circuit.

Each of the elevator circuits 321*a*, 321*b*, 322*a*, and 322*b* (also collectively or individually referred to as elevator circuits 32*x*) may have the architecture exemplified in the circuit block diagram of FIG. 4.

An elevator circuit 32*x* includes an input terminal 402 configured to receive a low-voltage input signal In (e.g., LV1*a*, LV1*b*, LV2*a* or LV2*b* with reference to FIG. 3) and an output terminal 404 configured to produce a high-voltage output signal Out (e.g., HV1*a*, HV1*b*, HV2*a* or HV2*b* with reference to FIG. 3).

The elevator circuit 32*x* includes a latch including two inverters INV3 and INV4. Inverters INV3 and INV4 are biased between a higher voltage $V_H$ and a lower voltage $V_L$. The values of voltages $V_H$ and $V_L$ are chosen so that the elevator circuit 32*x* is subject to a low-voltage domain (e.g., of about 2 V or 2.5 V). For instance, in the case of elevator circuit 321*a*, $V_H$ may be equal to Vin1 and $V_L$ may be equal to s_GND; in the case of elevator circuits 321*b* and 322*b*, $V_H$ may be equal to Vout and $V_L$ may be equal to e_GND; in the case of elevator circuit 322*a*, $V_H$ may be equal to Vin2 and $V_L$ may be equal to GND. The output terminal of inverter INV3 is connected to the input terminal of inverter INV4 at a node 40 and the output terminal of inverter INV4 is connected to the input terminal of inverter INV3 at a node 42. The voltage swing of the input signal In is between ground GND and $V_L$.

As exemplified in FIG. 4, a transistor N4 (e.g., an n-channel MOS transistor) has a conductive channel arranged between node 40 and the input terminal 402. Optionally, another transistor P4 (e.g., a p-channel MOS transistor) has a conductive channel arranged between node 40 and the input terminal 402, in series to transistor N4. In particular, transistor N4 has a source terminal coupled to node 402 to receive the input signal In, a drain terminal coupled to the drain terminal of transistor P4, and a gate terminal configured to receive the lower bias voltage $V_L$ (e.g., 2.5 V). Transistor P4 has a drain terminal coupled to the drain terminal of transistor N4, a source terminal coupled to node 40, and a gate terminal configured to receive the lower bias voltage $V_L$.

As exemplified in FIG. 4, a transistor N5 (e.g., an n-channel MOS transistor) has a conductive channel arranged between node 42 and a node 46 where the complement signal In of the input signal In is produced by a further inverter 44 having its input terminal coupled to node 402. Optionally, another transistor P5 (e.g., a p-channel MOS transistor) has a conductive channel arranged between node 42 and node 46, in series to transistor N5. In particular, transistor N5 has a source terminal coupled to node 46 to receive signal In, a drain terminal coupled to the drain terminal of transistor P5, and a gate terminal configured to receive the lower bias voltage $V_L$. Transistor P5 has a drain terminal coupled the drain terminal of transistor N5, a source terminal coupled to node 42, and a gate terminal configured to receive the lower bias voltage $V_L$.

Additionally, a first buffer circuit B3 biased between voltage $V_H$ and voltage $V_L$ has an input terminal connected to node 40 and an output terminal connected to the output terminal 404 of the elevator circuit 32*x* to produce the high-voltage output signal Out.

Optionally, a second buffer circuit B4 biased between voltage $V_H$ and voltage $V_L$ has an input terminal connected to node 42 and an output terminal connected to a further output terminal 406 of the elevator circuit 32*x* to produce the complement Out of the high-voltage output signal Out.

Figure 5:
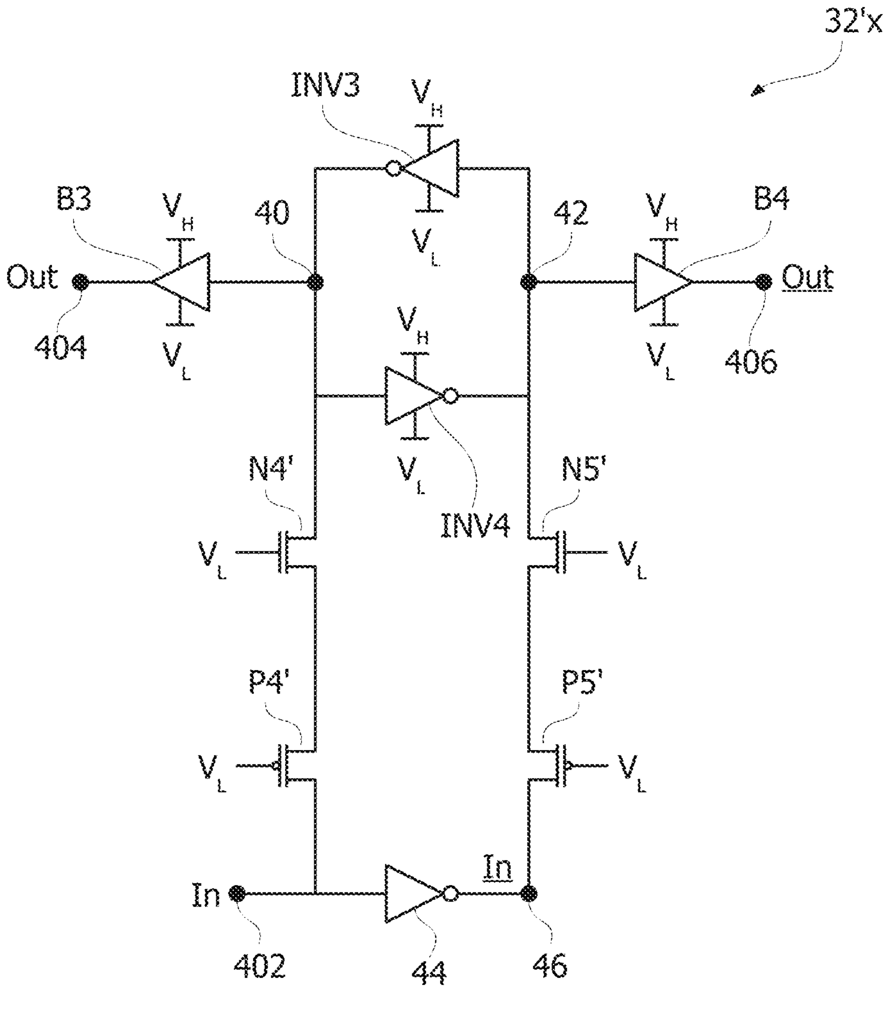
FIG. 5 is a circuit block diagram exemplary of another elevator circuit.

As exemplified in FIG. 5, modifying the architecture of FIG. 4 provides an elevator circuit 32'*x* that can be used for negative voltages. Substantially, the elevator circuit 32'*x* of FIG. 5 is the same as in FIG. 4, with p-channel MOS transistors P4' and P5' in the place of the n-channel MOS transistors N4 and N5, as well as n-channel MOS transistors N4' and N5' in the place of the p-channel MOS transistors P4 and P5. The higher supply voltage $V_H$ may be equal to ground voltage GND, and the lower supply voltage $V_L$ may be a negative voltage. The voltage of the input signal In (and its complement In) may be in the range of 0 V to about 1 V.

Resorting to the architecture of FIG. 4 for the elevator circuits 32*x* (i.e., by driving the elevator circuits from their source terminals instead from their gate terminals as in FIG. 2), the electrical components are kept in a low voltage range (e.g., a voltage range of about 2 V or 2.5 V) and do not need to be sized for high-voltage rating.

As anticipated, high-voltage switch circuits as disclosed herein may be used in the control circuits of a memory, such as in the row decoder circuits.

One or more embodiments as exemplified herein may thus be advantageous insofar as they facilitate managing "high" voltages (e.g., in the range of 0 V to 5 V) without resorting to high-voltage rating devices but using (only) low-voltage rating devices (e.g., in the range of 0 V to 2.5 V). This reduces the thickness of the gate oxide, the area occupation, and reduces the number of manufacturing steps, thus reducing manufacturing costs (masks costs) without degrading the performance.

Without prejudice to the underlying principles, the details and embodiments may vary, even significantly, with respect to what has been described by way of example, without departing from the extent of protection.

The extent of protection is determined by the annexed claims.

What is claimed is:

1. A switch circuit, comprising:

a first input node configured to receive a first input voltage;

a second input node configured to receive a second input voltage, the second input voltage being lower than the first input voltage;

an output node configured to produce an output voltage switchable between the first input voltage and the second input voltage;

a first transistor of a p-channel metal-oxide-semiconductor (PMOS) type having a first conductive terminal coupled to the first input node;

a second transistor of the PMOS type having a first conductive terminal coupled to a second conductive terminal of the first transistor, a second conductive terminal of the second transistor coupled to the output node;

a third transistor of the PMOS type having a first conductive terminal coupled to the second input node;

a fourth transistor of the PMOS type having a first conductive terminal coupled to a second conductive terminal of the third transistor, a second conductive terminal of the fourth transistor coupled to the output node;

a first elevator circuit configured to generate, at an output terminal of the first elevator circuit, a first shifted control signal based on a first low-voltage control signal, the output terminal of the first elevator circuit coupled to a control terminal of the first transistor, the first elevator circuit biased between the first input voltage and a shifted ground voltage;

a second elevator circuit configured to generate, at an output terminal of the second elevator circuit, a second shifted control signal based on a second low-voltage control signal, the output terminal of the second elevator circuit coupled to a control terminal of the second transistor, the second elevator circuit biased between the output voltage and an elevated ground voltage;

a third elevator circuit configured to generate, at an output terminal of the third elevator circuit, a third shifted control signal based on a third low-voltage control signal, the output terminal of the third elevator circuit coupled to a control terminal of the third transistor, the third elevator circuit biased between the second input voltage and a ground voltage; and a fourth elevator circuit configured to generate, at an output terminal of the fourth elevator circuit, a fourth shifted control signal based on a fourth low-voltage control signal, the output terminal of the fourth elevator circuit coupled to a control terminal of the fourth transistor, the fourth elevator circuit biased between the output voltage and the elevated ground voltage.

2. The switch circuit of claim 1, wherein the shifted ground voltage is a fixed voltage, and wherein a difference between the first input voltage and the shifted ground voltage is between 2 and 2.5V, inclusive.

3. The switch circuit of claim 1, wherein the elevated ground voltage is a variable voltage switchable between the shifted ground voltage and the ground voltage, and wherein the elevated ground voltage is switched to:

the shifted ground voltage, in response to the output voltage being switched to the first input voltage; and the ground voltage, in response to the output voltage being switched to the second input voltage.

4. The switch circuit of claim 1, further comprising a precharge circuit coupled between the output node and the ground voltage, wherein the precharge circuit is activated in response to the output voltage being switched from the first input voltage to the second input voltage.

5. The switch circuit of claim 4, wherein the precharge circuit comprises:

a transistor controllable by a precharge signal; and a cascode device coupled in series between the transistor and the output node.

6. The switch circuit of claim 5, further comprising a control circuit configured to:

generate the first low-voltage control signal, the second low-voltage control signal, the third low-voltage control signal, the fourth low-voltage control signal, and the elevated ground voltage;

switch the output voltage from the first input voltage to the second input voltage by sequentially:

deactivating the first transistor and the second transistor, setting the elevated ground voltage to the ground voltage, and activating the third transistor and the fourth transistor; and switch the output voltage from the second input voltage to the first input voltage by sequentially:

deactivating the third transistor and the fourth transistor, setting the elevated ground voltage to the shifted ground voltage, and activating the first transistor and the second transistor.

7. The switch circuit of claim 6, wherein deactivating the first transistor and the second transistor comprises activating the precharge circuit to lower the output voltage, and wherein activating the third transistor and the fourth transistor comprises deactivating the precharge circuit.

8. The switch circuit of claim 1, wherein the first input voltage is between 4.5 and 5 V inclusive, and wherein the second input voltage is between 2 and 2.5 V inclusive.

9. The switch circuit of claim 1, wherein each of the first elevator circuit, the second elevator circuit, the third elevator circuit, and the fourth elevator circuit comprises:

an input node configured to receive a low-voltage control signal;

an output node configured to provide a shifted control signal;

a latch circuit including a first latched inverter and a second latched inverter, the first latched inverter having an input terminal coupled to a first latch node and an output terminal coupled to a second latch node, the second latched inverter having an input terminal coupled to the second latch node and an output terminal coupled to the first latch node, the second latch node is coupled to the output node;

an inverter coupled between the input node and a further node and configured to produce, at the further node, a complement signal of the low-voltage control signal;

a fifth transistor having a source terminal coupled to the input node to receive the respective low-voltage control signal and a drain terminal coupled to the second latch node; and a sixth transistor having a source terminal coupled to the further node to receive the complement signal of the low-voltage control signal and a drain terminal coupled to the first latch node.

10. The switch circuit of claim 9, wherein each of the first elevator circuit, the second elevator circuit, the third elevator circuit, and the fourth elevator circuit comprises:

a seventh transistor having a conductive terminal arranged between the drain terminal of the fifth transistor and the second latch node; and an eighth transistor having a conductive terminal arranged between the drain terminal of the sixth transistor and the first latch node.

11. A method of operating a switch circuit, the method comprising:

receiving, at a first input node of the switch circuit, a first input voltage, wherein a first transistor of the switch circuit includes a first conductive terminal coupled to the first input node;

receiving, at a second input node of the switch circuit, a second input voltage, the second input voltage being lower than the first input voltage;

producing, at an output node of the switch circuit, an output voltage switchable between the first input voltage and the second input voltage, wherein a second transistor of the switch circuit includes a first conductive terminal coupled to a second conductive terminal of the first transistor, a second conductive terminal of the second transistor coupled to the output node, wherein a third transistor of the switch circuit includes a first conductive terminal coupled to the second input node, wherein a fourth transistor of the switch circuit includes a first conductive terminal coupled to a second conductive terminal of the third transistor, a second conductive terminal of the fourth transistor coupled to the output node;

generating, at an output terminal of a first elevator circuit, a first shifted control signal based on a first low-voltage control signal, the output terminal of the first elevator circuit coupled to a control terminal of the first transistor, the first elevator circuit biased between the first input voltage and a shifted ground voltage, wherein the shifted ground voltage is a fixed voltage, and wherein a difference between the first input voltage and the shifted ground voltage is between 2 and 2.5V, inclusive;

generating, at an output terminal of a second elevator circuit, a second shifted control signal based on a second low-voltage control signal, the output terminal of the second elevator circuit coupled to a control terminal of the second transistor, the second elevator circuit biased between the output voltage and an elevated ground voltage;

generating, at an output terminal of a third elevator circuit, a third shifted control signal based on a third low-voltage control signal, the output terminal of the third elevator circuit coupled to a control terminal of the third transistor, the third elevator circuit biased between the second input voltage and a ground voltage; and generating, at an output terminal of a fourth elevator circuit, a fourth shifted control signal based on a fourth low-voltage control signal, the output terminal of the fourth elevator circuit coupled to a control terminal of the fourth transistor, the fourth elevator circuit biased between the output voltage and the elevated ground voltage.

12. The method of claim 11, wherein the elevated ground voltage is a variable voltage switchable between the shifted ground voltage and the ground voltage, the method further comprising:

switching the elevated ground voltage to the shifted ground voltage in response to the output voltage being switched to the first input voltage; and switching the elevated ground voltage to the ground voltage in response to the output voltage being switched to the second input voltage.

13. The method of claim 11, further comprising:

generating, by a control circuit of the switch circuit, the first low-voltage control signal, the second low-voltage control signal, the third low-voltage control signal, the fourth low-voltage control signal, and the elevated ground voltage;

switching, by the control circuit, the output voltage from the first input voltage to the second input voltage by sequentially:

deactivating the first transistor and the second transistor, setting the elevated ground voltage to the ground voltage, and activating the third transistor and the fourth transistor; and switching, by the control circuit, the output voltage from the second input voltage to the first input voltage by sequentially:

deactivating the third transistor and the fourth transistor, setting the elevated ground voltage to the shifted ground voltage, and activating the first transistor and the second transistor.

14. A switch circuit configured to switch an output voltage at an output terminal of the switch circuit between a first input voltage and a second input voltage, the second input voltage being less than the first input voltage, the switch circuit comprising:

a first transistor having a source terminal couplable to the first input voltage;

a second transistor having a source terminal coupled to a drain terminal of the first transistor, a drain terminal of the second transistor coupled to the output terminal of the switch circuit;

a third transistor having a drain terminal couplable to the second input voltage;

a fourth transistor having a drain terminal coupled to a source terminal of the third transistor, a source terminal of the fourth transistor coupled to the output terminal of the switch circuit; and a plurality of elevator circuits, each elevator circuit configured to generate, at its output terminal, a shifted control signal based on a low-voltage control signal, wherein a first elevator circuit is biased between the first input voltage and a shifted ground voltage and configured to provide a first shifted control signal to a gate terminal of the first transistor, wherein a second elevator circuit is biased between the output voltage and an elevated ground voltage and configured to provide a second shifted control signal to a gate terminal of the second transistor, wherein a third elevator circuit is biased between the second input voltage and a ground voltage and configured to provide a third shifted control signal to a gate terminal of the third transistor, and wherein a fourth elevator circuit is biased between the output voltage and the elevated ground voltage and configured to provide a fourth shifted control signal to a gate terminal of the fourth transistor.

15. The switch circuit of claim 14, further comprising a control circuit configured to generate the low-voltage control signal and the elevated ground voltage.

16. The switch circuit of claim 14, further comprising a control circuit configured to switch the output voltage from the first input voltage to the second input voltage by sequentially deactivating the first transistor and the second transistor, setting the elevated ground voltage to the ground voltage, and activating the third transistor and the fourth transistor.

17. The switch circuit of claim 14, further comprising a control circuit configured to switch the output voltage from the second input voltage to the first input voltage by sequentially deactivating the third transistor and the fourth transistor, setting the elevated ground voltage to the shifted ground voltage, and activating the first transistor and the second transistor.

18. The switch circuit of claim 14, wherein the first input voltage is between 4.5 and 5 V inclusive, and wherein the second input voltage is between 2 and 2.5 V inclusive.

19. The method of claim 13, wherein deactivating the first transistor and the second transistor comprises activating a precharge circuit to lower the output voltage, and wherein activating the third transistor and the fourth transistor comprises deactivating the precharge circuit.

20. The method of claim 11, wherein the first, second, third, and fourth transistors are of a p-channel metal-oxide-semiconductor (PMOS) type.

* * * * *